(12) United States Patent
Pang et al.

(10) Patent No.: US 8,836,449 B2
(45) Date of Patent: Sep. 16, 2014

(54) VERTICALLY INTEGRATED MODULE IN A WAFER LEVEL PACKAGE

(76) Inventors: Wei Pang, Beijing (CN); Hao Zhang, Zhuhai (CN)

( * ) Notice: Subject to any disclaimer, the term of this patent is extended or adjusted under 35 U.S.C. 154(b) by 1047 days.

(21) Appl. No.: 12/869,925

(22) Filed: Aug. 27, 2010

(65) Prior Publication Data

US 2012/0049978 A1 Mar. 1, 2012

(51) Int. Cl.
*H03H 9/54* (2006.01)
*H03H 9/05* (2006.01)
*H03H 9/205* (2006.01)

(52) U.S. Cl.
CPC ........... *H03H 9/0547* (2013.01); *H03H 9/0571* (2013.01)
USPC .......................................... 333/187; 333/189

(58) Field of Classification Search
CPC ................................. H03H 9/205; H03H 3/02
USPC .................................................. 333/186–192
See application file for complete search history.

(56) References Cited

U.S. PATENT DOCUMENTS

| 7,202,560 | B2 | | 4/2007 | Dungan et al. | |
|---|---|---|---|---|---|
| 7,342,351 | B2 | * | 3/2008 | Kubo et al. | 310/344 |
| 7,378,922 | B2 | * | 5/2008 | Kubo et al. | 333/189 |
| 7,443,270 | B2 | * | 10/2008 | Motai | 333/187 |
| 7,622,846 | B2 | * | 11/2009 | Song et al. | 310/324 |
| 7,675,154 | B2 | * | 3/2010 | Hong et al. | 257/686 |
| 7,863,699 | B2 | * | 1/2011 | Dropmann et al. | 257/416 |
| 2007/0012655 | A1 | * | 1/2007 | Kwon et al. | 216/13 |

* cited by examiner

Primary Examiner — Dean O Takaoka
Assistant Examiner — Alan Wong
(74) Attorney, Agent, or Firm — Morris, Manning & Martin, LLP; Tim Tingkang Xia, Esq.

(57) ABSTRACT

In one aspect of the present invention, an integrated wafer level package includes a first wafer and a second wafer spaced apart to define a first gap therebetween, a first bulk acoustic wave (BAW) filter disposed on the first wafer and a second BAW filter disposed on the second wafer, where the second BAW filter faces directly the first BAW filter to define a second gap therebetween, a seal ring disposed between the first wafer and the second wafer in the first gap such that a seal is formed surrounding the first BAW filter and the second BAW filter and defining a cavity between the seal ring and the first BAW filter and the second BAW filter, and at least one external contact accessible externally to the wafer level package and electrically coupled to at least one of the first BAW filter and the second BAW filter.

26 Claims, 9 Drawing Sheets

VERTICALLY INTEGRATED MODULE IN A WAFER LEVEL PACKAGE

CROSS-REFERENCE TO RELATED PATENT APPLICATION

Some references, which may include patents, patent applications and various publications, are cited in a reference list and discussed in the description of this invention. The citation and/or discussion of such references is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates generally to a wafer level package, and more particularly, to a vertically integrated module in a wafer level package.

BACKGROUND

Consumer electronics, such as mobile phones and personal digital assistants (PDAs), continue to decrease in size and price and increase in functionality. As a result, these electronics devices place severe limitations on both the size and cost of the components (such as integrated circuits (ICs) and Micro-Electro-Mechanical Systems (MEMS) devices) contained therein. Radio frequency (RF) filters including bulk acoustic wave (BAW) filters are ubiquitous components in all RF front ends and play a key role in the design of cellular handsets. There has been a continuing effort to provide inexpensive, compact filter and/or duplexer units that must be tuned to precise frequencies. A BAW resonator comprises at least one piezoelectric thin film and at least one pair of a top electrode and a bottom electrode sandwiching the piezoelectric film therebetween. The resonance frequency of a BAW resonator is the frequency for which the mechanical waves propagate in the device. The half wavelength of the propagating waves is equal to the total thickness of the device for a given phase velocity of the mechanical wave in the material. Besides the thickness of the piezoelectric layer, the thickness and material properties of other layers in the BAW resonator also affect the resonance frequency. One process that makes the production of BAW filters challenging is to guarantee an adequate accuracy of deposited film thickness values across the whole wafer from run to run, in order to keep the frequency tolerance range as low as about 0.1%. Final frequency trimming of passivation layer at the top surface of resonator based on measured frequency distribution is usually necessary to achieve a decent yield.

A typical example of BAW filter is the so-called ladder filter, which often includes a combination of several resonator pairs, one placed in series with the signal to be filtered and the other shunting the signal to be filtered. The two resonators have slightly different resonance frequencies, usually a few percent apart and are usually made the same except for adding a thin mass loading layer to one or the other to shift slightly its resonant frequency compared to the other of the pair. BAW resonators are also used as components of filters making up duplexers in a mobile phone, which in turn includes a transmitter (Tx) filter and a receiver (Rx) filter. A method of fabricating both Tx and Rx filter side by side on a single substrate is disclosed in U.S. Pat. No. 6,407,649. The required frequency difference between Tx and Rx filters is generated by providing a tuning layer in the stack of either of filters. However, in many cases, for example, for wideband code division multiple access (WCDMA) Band I application, the center frequency of Tx band is approximately 10% lower than that of Rx band. In order to achieve optimal filtering performance, the layered stack composition of Tx and Rx filter is quite distinct, and separate frequency tuning of Tx and Rx filters is required, but not practically viable for two dies with distance smaller than 5 mm. In accordance with the demands for smaller size and multi-functionality in mobile electronic products, much effort is being invested in developing the multi-band filter module, comprising, for example, a Global Positioning System (GPS) filter with a passband centered at 1.575 GHz, and a code division multiple access (CDMA) filter with a passband centered at 1.960 GHz. In U.S. Pat. No. 6,518,860, piezoelectric films with different thicknesses have to be deposited separately, thus significantly increasing processing complexity and manufacturing cost. Similar to the problem mentioned earlier, frequency trimming of side by side filters at different bands is not feasible. Overall, the fabrication of BAW duplexer and/or multi-band BAW filters on a single substrate requires compromises in filter performance and manufacturing yield as well as expensive process development.

Therefore, a heretofore unaddressed need exists in the art to address the aforementioned deficiencies and inadequacies.

SUMMARY OF THE INVENTION

In one aspect, the present invention provides an integrated wafer level package. In one embodiment, the integrated wafer level package includes a first wafer having a first surface and an opposite, second surface, and a second wafer having a first surface and an opposite, second surface, where the first wafer and the second wafer are spaced apart such that the second surface of the first wafer faces the first surface of the second wafer, defining a first gap therebetween. The integrated wafer level package also includes a first BAW filter disposed on the second surface of the first wafer, and a second BAW filter disposed on the first surface of the second wafer, where the first BAW filter faces directly the second BAW filter, defining a second gap therebetween. Further, the integrated wafer level package includes a seal ring disposed between the first wafer and the second wafer such that a seal is formed surrounding the first BAW filter and the second BAW filter and defining a cavity between the seal ring and the first BAW filter and the second BAW filter, and at least one external contact that is accessible externally to the wafer level package and is electrically coupled to at least one of the first BAW filter and the second BAW filter.

The integrated wafer level package may further have at least one solder bump disposed on the at least one external contact. In one embodiment, the at least one external contact has a first external contact electrically coupled to the first BAW filter, and a second external contact electrically coupled to the second BAW filter.

Additionally, the integrated wafer level package includes a first column disposed between the first wafer and the second wafer and adjacent to a first via, thereby facilitating the electrical coupling between the first external contact and the first BAW filter, or between the first external contact and the second BAW filter. The integrated wafer level package also includes a second column disposed between the first wafer and the second wafer and adjacent to a second via, thereby facilitating the electrical coupling between the second external contact and the second BAW filter, or between the second external contact and the first BAW filter. In one embodiment, the first column is electrically coupled to at least one of the first BAW filter and the second BAW filter. The second column is electrically coupled to at least one of the first BAW filter and the second BAW filter.

The first via and the second via are provided in the first wafer, for facilitating electrical couplings between the first external contact and the first BAW filter, and between the second external contact and the second BAW filter, respectively. In one embodiment, each of the first via and the second via is formed by at least one of wet etching, dry etching, deep reactive ion etching (DRIE), ultrasonic milling, drilling, mechanical drilling, or laser drilling. Each of the first via and the second via is filled with a conductive material.

The seal formed by the seal ring is a hermetic seal. In one embodiment, the seal is formed by bonding the seal ring with the first wafer and the second wafer by at least one of anodic bonding, thermal compression bonding, eutectic bonding, solder bonding, glass frit bonding, adhesive bonding, or polymer bonding.

In one embodiment, the seal ring includes a first metal pad disposed on the second surface of the first wafer, a second metal pad disposed on the first surface of the second wafer, a dielectric ring formed on the second metal pad, and a metal layer surrounding the dielectric ring, the top surface of the metal layer being bonded with the first metal pad. The first metal pad, the second metal pad, and the metal layer are made of a same material, or different materials. In one embodiment, each of the first metal pad, the second metal pad, and the metal layer is made of a material including Cu, Au, Ge, Al, Ni, Ag, or a combination thereof. The dielectric ring is made of $SiO_2$, SiN, $Al_2O_3$, spin-on glass (SOG), or glass frit.

In another embodiment, the seal ring includes a first metal pad disposed on the second surface of the first wafer, a second metal pad disposed on the first surface of the second wafer, and a metal ring formed on the second metal pad, the top surface of the metal ring being bonded with the first metal pad. The first metal pad, the second metal pad, and the metal ring are made of a same material, or different materials. In one embodiment, each of the first metal pad, the second metal pad, and the metal ring is made of a material including Cu, Au, Ge, Al, Ni, Ag, or a combination thereof. In one embodiment, the metal ring is formed by one of electroplating, electroless plating, physical vapor deposition (PVD), or chemical vapor deposition (CVD).

In yet another embodiment, the seal ring includes a first metal pad disposed on the second surface of the first wafer, a second metal pad disposed on the first surface of the second wafer, a metal ring formed on the second metal pad, a diffusion barrier formed on the top surface of the metal ring; and a solder layer formed on the diffusion barrier, the top surface of the solder layer being bonded with the first metal pad. Each of the first metal pad and the second metal pad is made of a material including Au, Ag, Ni, Cu, Ti, or a combination thereof. The metal ring is made of Au or Cu. In one embodiment, the metal ring is formed by one of electroplating, electroless plating, PVD, or CVD. The solder layer is made of a composite material comprising Sn and at least one of Au, Ag, Cu, Zn, Si, Ge, Pb, In, Bi, and Sb.

In a further embodiment, the seal ring includes a first metal pad disposed on the second surface of the first wafer, a dielectric film formed on the first metal pad, wherein the dielectric film, the first metal pad, and the first wafer define a third via that runs through the dielectric film and the first metal pad and ends in the body of the first wafer, a second metal pad disposed on the first surface of the second wafer, a first ring formed on the second metal pad, the first ring having a fourth via that runs through the height of the first ring, the top surface of the first ring being bonded with the dielectric film, and a conductive material that fills the third via and the fourth via. Each of the first metal pad and the second metal pad is made of a material including Cu, Au, Al, or a combination thereof. The dielectric film is made of a material including $SiO_2$, SiN, $Al_2O_3$, or spin-on glass (SOG). The first ring is made of a dielectric material including $SiO_2$, SiN, $Al_2O_3$, SOG, or glass frit, or a polymer material including photoimagable polymer, benzocyclobutene (BCB), SU8, Parylene, Polyimide, Avatrel, polymethylmethacrylate (PMMA), polydimethylsiloxane (PDMS), or dry film resist.

In yet a further embodiment, the seal ring includes a ring made of a non-conductive material, disposed on the first surface of the second wafer, having a top surface to be bonded to the second surface of the first wafer. The non-conductive material includes a polymer film, dielectric film, glass frit, etc.

Moreover, the integrated wafer level package has a first protective layer surrounding the first BAW filter and defining a cavity therebetween, and a second protective layer surrounding the second BAW filter and defining a cavity therebetween.

Each of the first protective layer and the second protective layer is made of a material including polymer material, non-metallic material, metallic material, or a combination thereof. In one embodiment, the polymer material includes photoimagable polymer, BCB, SU8, Parylene, Polyimide, Avatrel, PMMA, PDMS, or a combination thereof. In another embodiment, the non-metallic material includes silicon oxide, silicon nitride, silicon carbide, diamond, silicon, or a combination thereof. In yet another embodiment, the metallic material includes Cu, Au, Al, Pt, Ni, Ti, Cr, or a combination thereof.

In another aspect, the present invention provides a multi-pack integrated wafer level package having a plurality of integrated wafer level packages set forth immediately above, vertically stacked in a direction perpendicular to each wafer, where each wafer level package is attached to an adjacent wafer level package via a second seal ring.

In yet another aspect, the present invention provides an integrated wafer level package having a first wafer and a second wafer spaced apart to define a first gap therebetween, a first BAW filter disposed on the first wafer and a second BAW filter disposed on the second wafer, where the second BAW filter faces directly the first BAW filter to define a second gap therebetween, a third wafer spaced apart from the first wafer to define a third gap therebetween, a fourth wafer spaced apart from the third wafer to define a fourth gap therebetween, a third BAW filter disposed on the third wafer and a fourth BAW filter disposed on the fourth wafer, where the fourth BAW filter faces directly the third BAW filter to define a fifth gap therebetween, a first seal ring disposed between the first wafer and the second wafer such that a first seal is formed surrounding the first BAW filter and the second BAW filter and defining a first cavity between the first seal ring and the first BAW filter and the second BAW filter, a second seal ring disposed between the second wafer and the third wafer, a third seal ring disposed between the third wafer and the fourth wafer such that a second seal is formed surrounding the third BAW filter and the fourth BAW filter and defining a second cavity between the third seal ring and the third BAW filter and the fourth BAW filter, and at least one external contact that is accessible externally to the wafer level package and is electrically coupled to at least one of the first BAW filter, the second BAW filter, the third BAW filter, and the fourth BAW filter. In one embodiment, each of the first seal formed by the first seal ring and the second seal formed by the third seal ring is a hermetic seal.

In a further aspect, the present invention provides an integrated wafer level package having a first wafer and a second wafer spaced apart to define a first gap therebetween, a first micro device disposed on the first wafer and a second micro device disposed on the second wafer, where the second micro device faces directly the first micro device to define a second gap therebetween, a seal ring disposed between the first wafer and the second wafer such that a seal is formed surrounding the first micro device and the second micro device and defining a cavity between the seal ring and the first micro device and the second micro device, and at least one external contact that is accessible externally to the wafer level package and is electrically coupled to at least one of the first micro device and the second micro device. The seal formed by the seal ring is a hermetic seal.

In one embodiment, the at least one external contact includes a first external contact that is electrically coupled to the first micro device, and a second external contact that is electrically coupled to the second micro device.

In one embodiment, the first wafer has a first via through which an electrical coupling between the first external contact and the first micro device is made, and a second via through which an electrical coupling between the second external contact and the second micro device is made.

Further, the integrated wafer level package includes a first column disposed between the first wafer and the second wafer and adjacent to the first via, thereby facilitating the electrical coupling between the first external contact and the first micro device, or between the first external contact and the second micro device, and a second column disposed between the first wafer and the second wafer and adjacent to the second via, thereby facilitating the electrical coupling between the second external contact and the second micro device, or between the second external contact and the first micro device. The first column is electrically coupled to the first micro device and the second micro device. The second column is electrically coupled to the first micro device and the second micro device.

Additionally, the integrated wafer level package further includes a first column disposed between the first wafer and the second wafer and adjacent to the first via, thereby facilitating the electrical coupling between the first external contact and the first micro device or between the first external contact and the second micro device, and a second column disposed between the first wafer and the second wafer and adjacent to the second via, thereby facilitating the electrical coupling between the second external contact and the second micro device or between the second external contact and the first micro device. In one embodiment, the first column is electrically coupled to at least one of the first micro device and the second micro device. The second column is electrically coupled to at least one of the first micro device and the second micro device.

In one embodiment, the second micro device is a passive device and the first micro device is a BAW filter.

These and other aspects of the present invention will become apparent from the following description of the preferred embodiment taken in conjunction with the following drawings and their captions, although variations and modifications therein may be affected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein.

DETAILED DESCRIPTION

Figure 1:
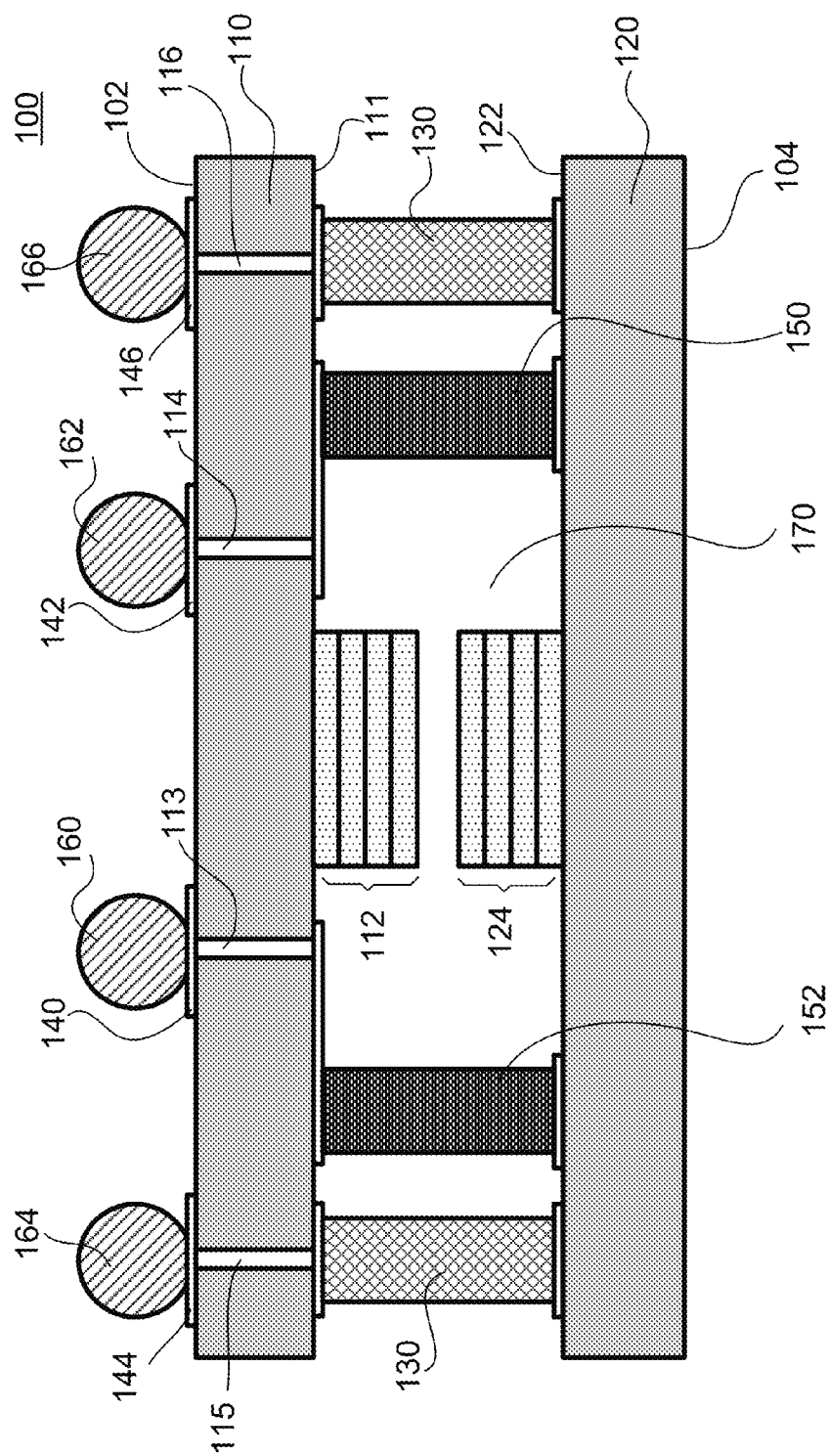
FIG. 1 shows schematically a cross sectional view of an integrated wafer level package, according to one embodiment of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, "plurality" means two or more.

As used herein, the terms "comprising," "including," "carrying," "having," "containing," "involving," and the like are to be understood to be open-ended, i.e., to mean including but not limited to.

The term "layer", as used herein, refers to a thin sheet or thin film.

The term "electrode", as used herein, is an electrically conductive layer or film comprising a single-layer structure or a multi-layer structure formed of one or more electrically conductive materials.

The term "piezoelectric layer" as used herein, is a layer comprising one or more different layers, of which at least one exhibits piezoelectric activity. The other layers may be non-piezoelectric dielectric or used to perform special performance effects like temperature coefficient compensation or to facilitate manufacturing like adhesion layers. In addition, the other layers are typically thin when compared to the at least one layer exhibiting piezoelectric activity.

One objective of the invention is to substantially reduce the footprint and cost of multi-band filters and/or duplexers by providing wafer scale vertical integration. Another objective of the invention is to maximize the device yield by independently trimming frequency of filters on each wafer before the packaging and wafer bonding process. Yet another objective of the invention is to provide an accessible external contact on the wafer level package where the filters can be electrically coupled to the external contact without undesirably increasing the die and package size. A further objective of the invention is to provide two or more sealed filter elements encapsulated in a wafer level package for preventing corrosion from ambient atmosphere.

In one aspect of the present invention, an integrated wafer level package includes a first acoustic filter on a substrate and a second acoustic filter on another substrate, two wafers are bonded after frequency of filter on each wafer is trimmed individually such that yield for each filter is maximized. By using the inverted filter wafer as its cap, this technique eliminates the need for an additional encapsulating structure for each filter element, which is necessary in conventional approaches for protecting the vibration parts from contamination. Because the two filters are vertically stacked, the lateral foot-print of the duplexer is reduced by at least a factor of two, compared to conventional approaches. Multi-band filters/duplexer could be formed in a similar way with even more area reduction. The wafer-to-wafer integration relies primarily on five processing technologies: wafer alignment, wafer bonding, electrical connection at the wafer bond interface, through wafer (silicon) via formation and wafer thinning. In one embodiment, each filter is packaged in a polymer/plastic or metal housing on the substrate and non-hermetic wafer bonding is sufficient.

In another aspect of the present invention, integration of wafers comprising devices made by heterogeneous technologies is attained. For example, BAW filters, passive components (e.g., inductors, capacitors), and/or RF switches built on silicon or other insulating substrate (e.g., SOI and sapphire) can be integrated into a single wafer package to form a RF front end module (e.g., Switchplexer). The main advantages include significant form factor miniaturization, replacement of long two dimensional interconnects with shorter vertical interconnects, the reduction of parasitics and performance improvement.

These and other aspects of the present invention are further described in the following examples, which should not be construed as limiting the scope of the present teachings in any way.

Example 1

Referring to FIG. 1, an integrated wafer level package 100 is shown according to one embodiment of the present invention. In the exemplary embodiment, the integrated wafer level package 100 has a first wafer 110, a second wafer 120, a first BAW filter 112, a second BAW filter 124, and a seal ring 130. The first wafer 110 has a first surface 102 and an opposite, second surface 111. The second wafer 120 has a first surface 122 and an opposite, second surface 104. The first wafer 110 and the second wafer 120 are spaced apart from each other such that the second surface 111 of the first wafer 110 faces the first surface 122 of the second wafer 120, thereby defining a first gap therebetween. The first BAW filter 112 is disposed on the second surface 111 of the first wafer 110, and the second BAW filter 124 is disposed on the first surface 122 of the second wafer 120. The first BAW filter 112 faces directly the second BAW filter 124, which defines a second gap therebetween. The seal ring 130 is disposed between the first wafer 110 and the second wafer 120 such that a seal is formed surrounding the first BAW filter 112 and the second BAW filter 124 and defining a cavity 170 between the seal ring 130 and the first BAW filter 112 and the second BAW filter 124. The cavity 170 keeps the first and second BAW filters 112 and 124 in a controlled environment and thus protected from moisture, dust, and other contaminants. The seal formed by the seal ring 130 can be either a hermetic seal or a non-hermetic seal.

The integrated wafer level package as described above forms a vertically integrated duplexer. The two wafers 110 and 120 are bonded through the seal ring 130 after the frequency of each filter is trimmed individually such that yield for each filter is maximized. Because the two filters 112 and 124 are vertically stacked, lateral area of the duplexer is reduced by at least a factor of two compared to conventional approaches. By using the inverted second wafer 120 as a cap, this technique eliminates the need for an additional encapsulating structure for each filter, which is normally required in conventional approaches for protecting the filter from moisture, dust, and other contaminants.

As shown in FIG. 1, the integrated wafer level package 100 further has a first external contact 140 that is electrically coupled to the first BAW filter 112, a second external contact 142 that is electrically coupled to the second BAW filter 124, a first solder bump 160 disposed on the first external contact 140, and a second solder bump 162 disposed on the second external contact 142. In addition, the first wafer 110 has a first via 113 through which an electrical coupling between the first external contact 140 and the first BAW filter 112 is made, and a second via 114 through which an electrical coupling between the second external contact 142 and the second BAW filter 124 is made. The first via 113 and the second via 114 are formed by a method including wet etching, dry etching, deep reactive ion etching (DRIE), ultrasonic milling, drilling, mechanical drilling, and laser drilling. The first via 113 and the second via 114 are filled with a conductive material including Cu, Au, Ge, Al, Ni, and Ag.

The integrated wafer level package 100 also has a third external contact 144 and a fourth external contact 146, a third solder pump 164 disposed on the third external contact 144, and a fourth solder bump 166 disposed on the fourth external contact 146. The first wafer 110 has a third via 115 through which electrical coupling between the third external contact 144 and the seal ring 130 is made, and a fourth via 116 through which electrical coupling between the fourth external contact 146 and the seal ring 130 is made. The vias 115/116, the external contacts 144/146 and the solder bumps 164/166 are optional. For example, in one embodiment shown in FIG. 6, the seal ring is made of non-conductive material such as polymer film, dielectric film, glass frit, etc., and no vias 115/116, external contacts 144/146 and solder bumps 164/166 are needed. In alternative embodiments, the integrated wafer level package may comprise more or fewer external contacts.

Further, the integrated wafer level package 100 has a first column 152 and a second column 150 disposed between the first wafer 110 and the second wafer 120. The first column 152 and the second column 150 are made of a same material as the seal ring or of a conducting material including Cu, Au, Ge, Al, Ni, and Ag. The first column 152 is aligned with or adjacent to the first via 113, and the second column 150 is aligned with or adjacent to the second via 114. In one embodiment, the first column 152 is electrically coupled to the first external contact 140 and to the first BAW filter 112. The second column 150 is electrically coupled to the second external contact 142 and to the second BAW filter 124, thereby facilitating the electrical coupling between the second external contact 142 and the second BAW filter 124. In another embodiment, the first column 152 may be electrically coupled to both the first BAW filter 112 and the second BAW filter 124, thereby electrically connecting the first BAW filter 112 with the second BAW filter 124. In this case, the first external contact provides access to both BAW filters through the first via 113. Similarly, the second column 150 may be electrically coupled to both the first BAW filter 112 and the second BAW filter 124. In this case, the second external contact 142 provides access to both BAW filters through the second via 114.

The first wafer 110 and the second wafer 120 are bonded via a seal ring 130 using a bonding method including anodic bonding, thermal compression bonding, eutectic bonding, solder bonding, glass frit bonding, adhesive bonding, and polymer bonding.

Figure 2:
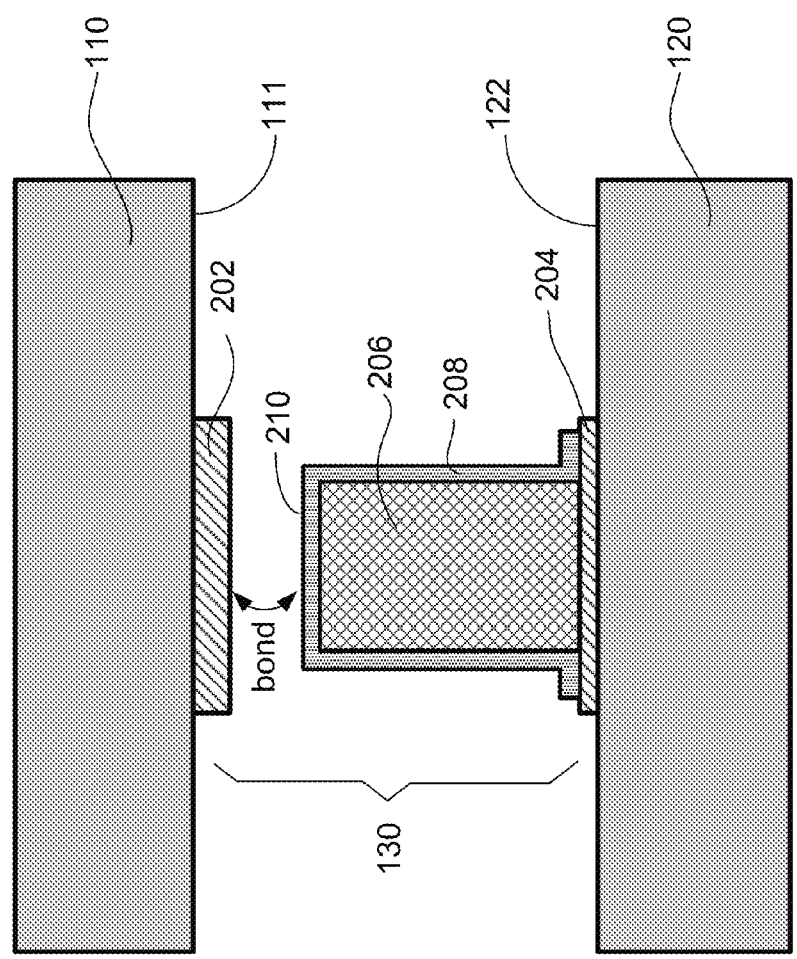
FIG. 2 shows schematically a cross sectional view of a seal ring, according to one embodiment of the present invention.

Referring to FIG. 2, in the exemplary embodiment, the seal ring 130 includes a first metal pad 202 disposed on the second surface 111 of the first wafer 110, a second metal pad 204 disposed on the first surface 122 of the second wafer 120, a dielectric ring 206 formed on the second metal pad 204, and a metal layer 208 surrounding the dielectric ring 206. The top surface 210 of the metal layer 208 is bonded with the first metal pad 202 using a method including thermal compression bonding and eutectic bonding. Each of the first metal pad 202, the second metal pad 204, and the metal layer 208 has a thickness ranging from about 1 µm to about 2 µm. The dielectric ring 206 has a height ranging from about 5 to about 8 µm. It is understood that each of the first metal pad 202, the second metal pad 204, the dielectric ring 206, and the metal layer 208 may have other thicknesses or heights than those described above. The first metal pad 202, the second metal pad 204, and the metal layer 208 may be made of a same material or of different materials, including Cu, Au, Ge, Al, Ni, Ag, or a combination thereof. The dielectric ring 206 may be made of $SiO_2$, SiN, or other insulating materials.

Figure 3:
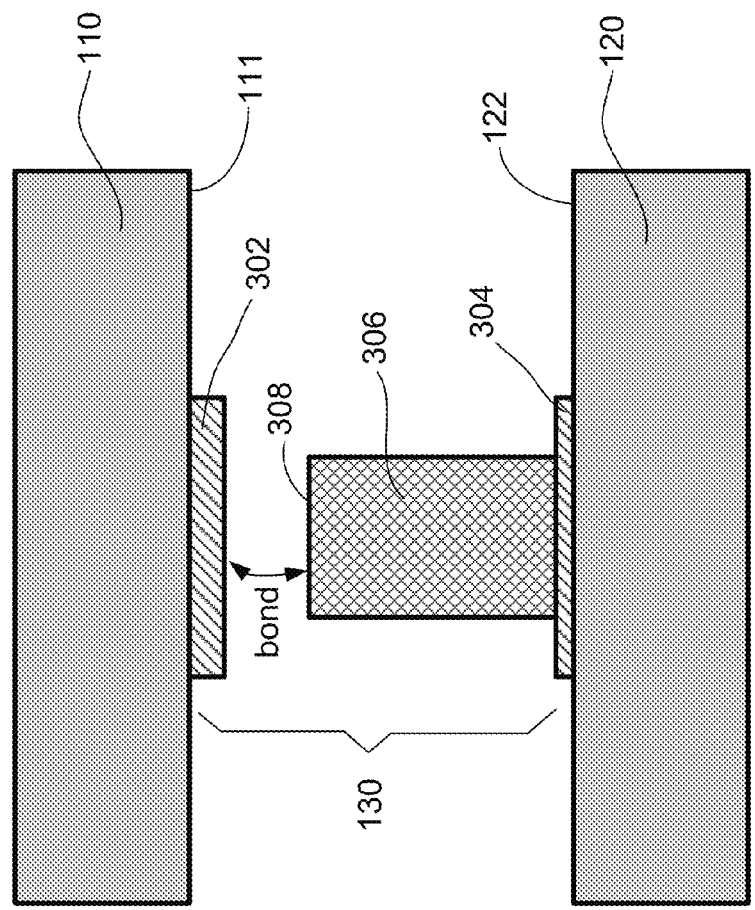
FIG. 3 shows schematically a cross sectional view of a seal ring, according to another embodiment of the present invention.

The seal ring 130 can be also formed in different forms. For example, in the exemplary embodiment shown in FIG. 3, the seal ring 130 includes a first metal pad 302 disposed on the second surface 111 of the first wafer 110, a second metal pad 304 disposed on the first surface 122 of the second wafer 120, and a metal ring 306 formed on the second metal pad 304. The top surface 308 of the metal ring 306 is bonded with the first metal pad 302 using a method such as thermal compression bonding. Each of the first metal pad 302 and the second metal pad 304 has a thickness ranging from about 1 µm to about 2 µm. The metal ring 306 has a height ranging from about 5 to about 10 µm. It is understood that each of the first metal pad 302, the second metal pad 304, and the metal ring 306 may have other thicknesses or heights than those described above. The first metal pad 302, the second metal pad 304, and the metal ring 306 are made of a same material or of different materials, including Cu, Au, Ge, Al, Ni, Ag, or a combination thereof. The metal ring 306 is formed by a method including electroplating, electroless plating, physical vapor deposition (PVD), or chemical vapor deposition (CVD).

Figure 4:
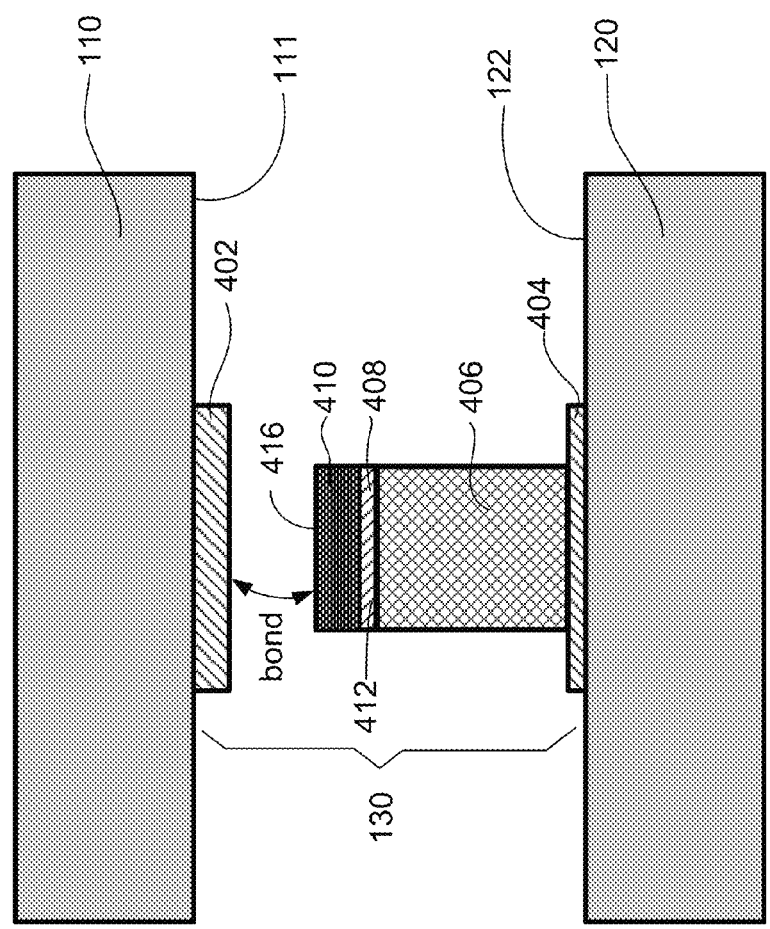
FIG. 4 shows schematically a cross sectional view of a seal ring, according to yet another embodiment of the present invention.

FIG. 4 shows another embodiment of the seal ring 130. In this embodiment, the seal ring 130 has a first metal pad 402 disposed on the second surface 111 of the first wafer 110, a second metal pad 404 disposed on the first surface 122 of the second wafer 120, a metal ring 406 formed on the second metal pad 404, a diffusion barrier 408 formed on the top surface 412 of the metal ring 406, and a solder layer 410 formed on the diffusion barrier 408. The top surface 416 of the solder layer 410 is bonded with the first metal pad 402 using eutectic bonding or solder bonding. Each of the first metal pad 402 and the second metal pad 404 has a thickness ranging from about 1 µm to about 2 µm. The metal ring 406 has a height ranging from about 5 to about 10 µm. The diffusion barrier 408 has a thickness of about 1 µm. The solder layer 410 has a thickness ranging from about 3 to about 5 µm. It is understood that each of the first metal pad 402, the second metal pad 404, the metal ring 406, the diffusion barrier 408, and the solder layer 410 may have other thicknesses or heights than those described above. Each of the first metal pad 402 and the second metal pad 404 is made of a material including Au, Ag, Ni, Cu, Ti, or a combination thereof. The metal ring 406 is made of a material including Au and Cu. The solder layer is made of a composite material comprising Sn and at least one of Au, Ag, Cu, Zn, Si, Ge, Pb, In, Bi, and Sb. The metal ring 406 is formed by a method including electroplating, electroless plating, PVD, and CVD.

Figure 5:
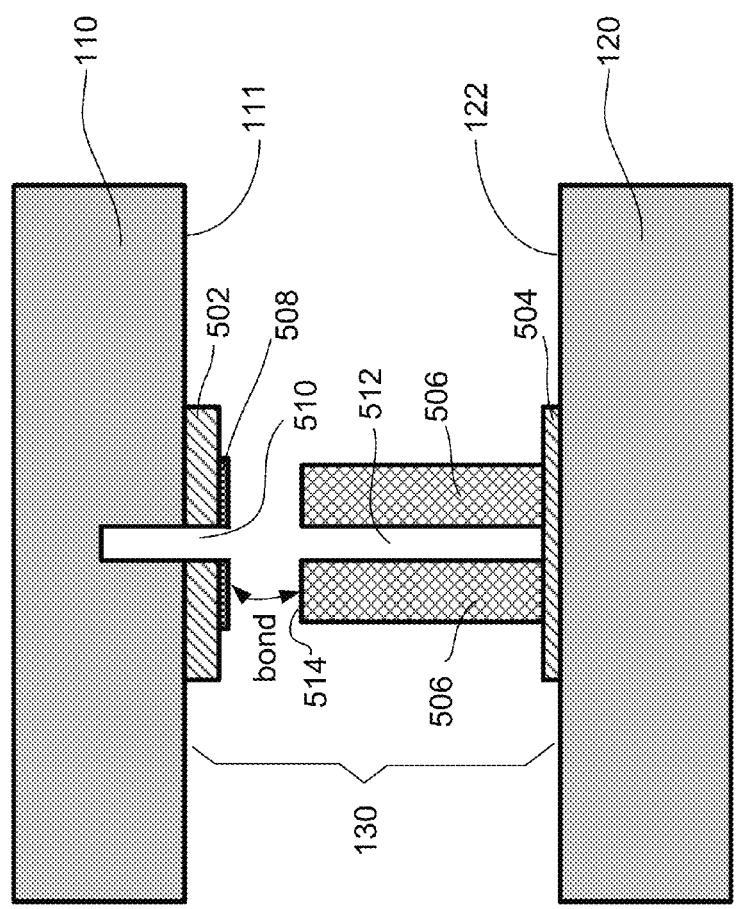
FIG. 5 shows schematically a cross sectional view of a seal ring, according to a further embodiment of the present invention.

FIG. 5 shows yet another embodiment of the seal ring 130. The seal ring 130 includes a first metal pad 502 disposed on the second surface 111 of the first wafer 110, a dielectric film 508 formed on the first metal pad 502, a second metal pad 504 disposed on the first surface 122 of the second wafer 120, and a ring 506 formed on the second metal pad 504. The dielectric film 508, the first metal pad 502, and the first wafer 110 define a third via 510 that runs through the dielectric film 508 and the first metal pad 502 and ends in the body of the first wafer 110. The ring 506 has a fourth via 512 that runs through the height of the ring 506. The third via 510 and the fourth via 512 are filled with a conductive material including Cu, Au, Ge, Al, Ni, and Ag. The top surface 514 of the ring 506 is bonded with the dielectric film 508. In another embodiment, the dielectric film 508 is not present and the top surface 514 of the ring 506 is bonded with the first metal pad 502. Each of the first metal pad 502 and the second metal pad 504 has a thickness ranging from about 1 µm to about 2 µm. The ring 506 has a height ranging from about 5 to about 10 µm. The dielectric film 508 has a thickness of about 0.5 µm. It is understood that each of the first metal pad 502, the second metal pad 504, the ring 506, and the dielectric film 508 may have other thicknesses or heights than those described above. Each of the first metal pad 502 and the second metal pad 504 is made of a material including Cu, Au, Al, and a combination thereof. The dielectric film 508 is made of a material including $SiO_2$, SiN, $Al_2O_3$, and spin-on glass (SOG). In one embodiment, the ring 506 is made of a dielectric material including $SiO_2$, SiN, $Al_2O_3$, spin-on glass (SOG), and glass frit. In another embodiment, the ring 506 is made of a polymer material including photo-imagable polymer, benzocyclobutene (BCB), SU8, Parylene, Polyimide, Avatrel, polymethylmethacrylate (PMMA), polydimethylsiloxane (PDMS), and dry film resist.

Figure 6:
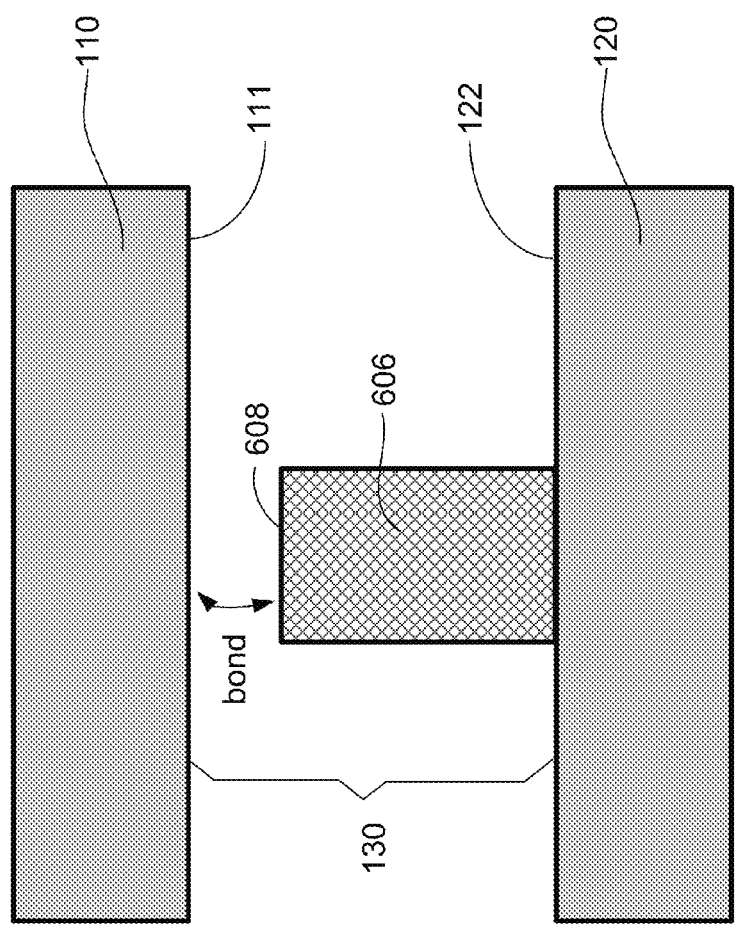
FIG. 6 shows schematically a cross sectional view of a seal ring, according to yet a further embodiment of the present invention.

FIG. 6 shows a further embodiment of the seal ring 130, where the seal ring 130 includes a ring 606 made of a non-conductive material, disposed on the first surface 122 of the second wafer 120, having a top surface 608 to be bonded to the second surface 111 of the first wafer 110. The non-conductive material includes a polymer film, dielectric film, glass frit, etc.

It is understood that other methods of bonding the first wafer and the second wafer than those described above may be used.

Figure 7:
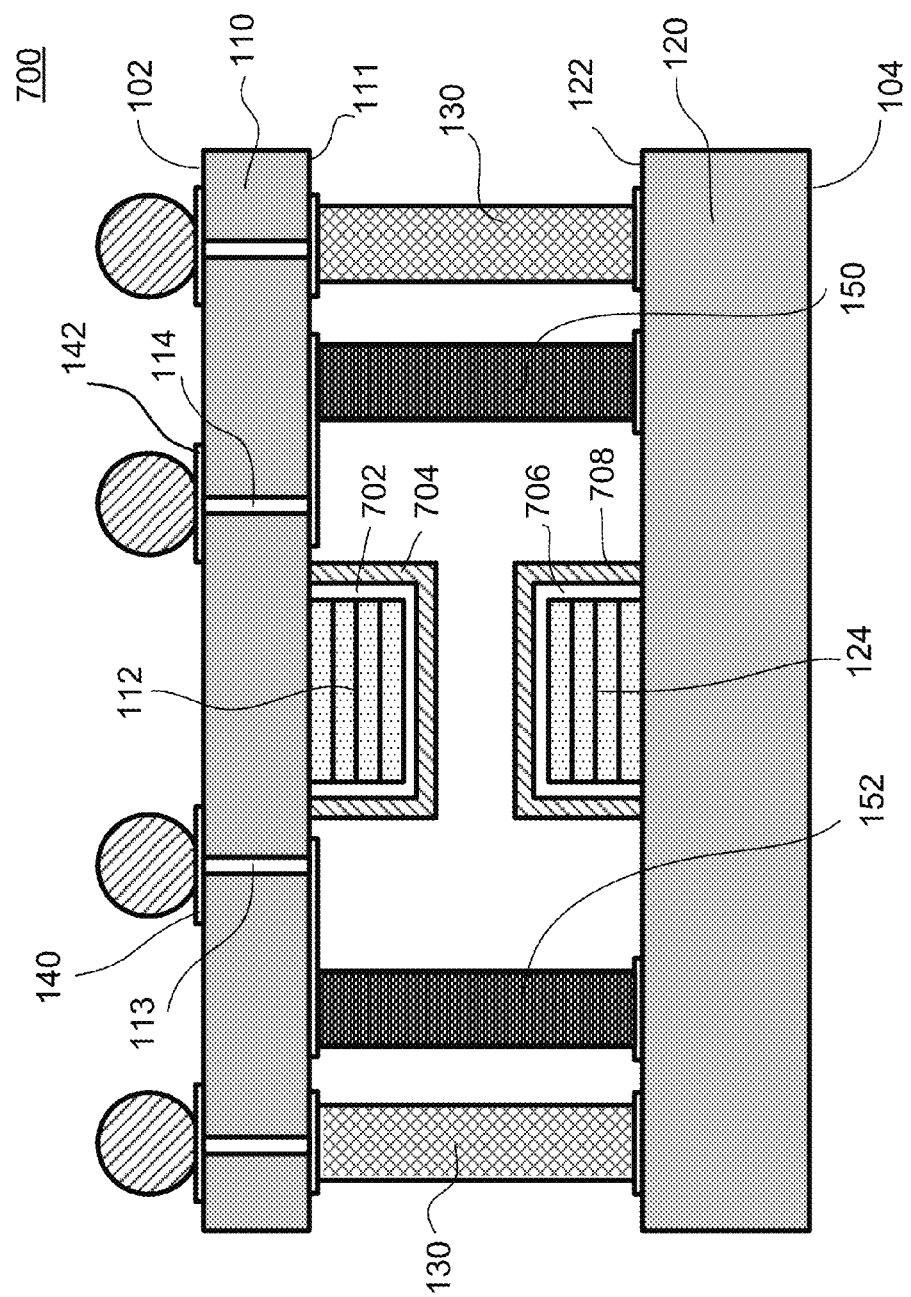
FIG. 7 shows schematically a cross sectional view of an integrated wafer level package, according to one embodiment of the present invention.

Referring to FIG. 7, the integrated wafer level package 700 is shown according another embodiment of the present invention. The integrated wafer level package 700 has similar structures to that of the integrated wafer level package 100 shown in FIG. 1. Further, the integrated wafer level package 700 has a first protective layer 704 surrounding the first BAW filter 112 and defining a cavity 702 therebetween, and a second protective layer 708 surrounding the second BAW filter 124 and defining a cavity 706 therebetween. The cavities 702 and 706 keep the first and second BAW filters in a controlled environment and thus protected from moisture, dust, and other contaminants. In this case, it is not essential for the seal formed by the seal ring 130 to be a hermetic seal. The first protective layer 704 and the second protective layer 708 may be made of a polymer material including photoimagable polymer, benzocyclobutene (BCB), SU8, Parylene, Polyimide, Avatrel, polymethylmethacrylate (PMMA), and polydimethylsiloxane (PDMS). In another embodiment, they may be made of a non-metallic material including silicon oxide, silicon nitride, silicon carbide, diamond, and silicon. In yet another embodiment, they may be made of a metallic material including Cu, Au, Al, Pt, Ni, Ti, Cr, or a combination thereof.

Example 2

In another embodiment, a plurality of integrated wafer level packages as described in Example 1 are stacked vertically, wherein each wafer level package is attached to an adjacent wafer level package via a second seal ring. As such, even more lateral area reduction is achieved.

Figure 8:
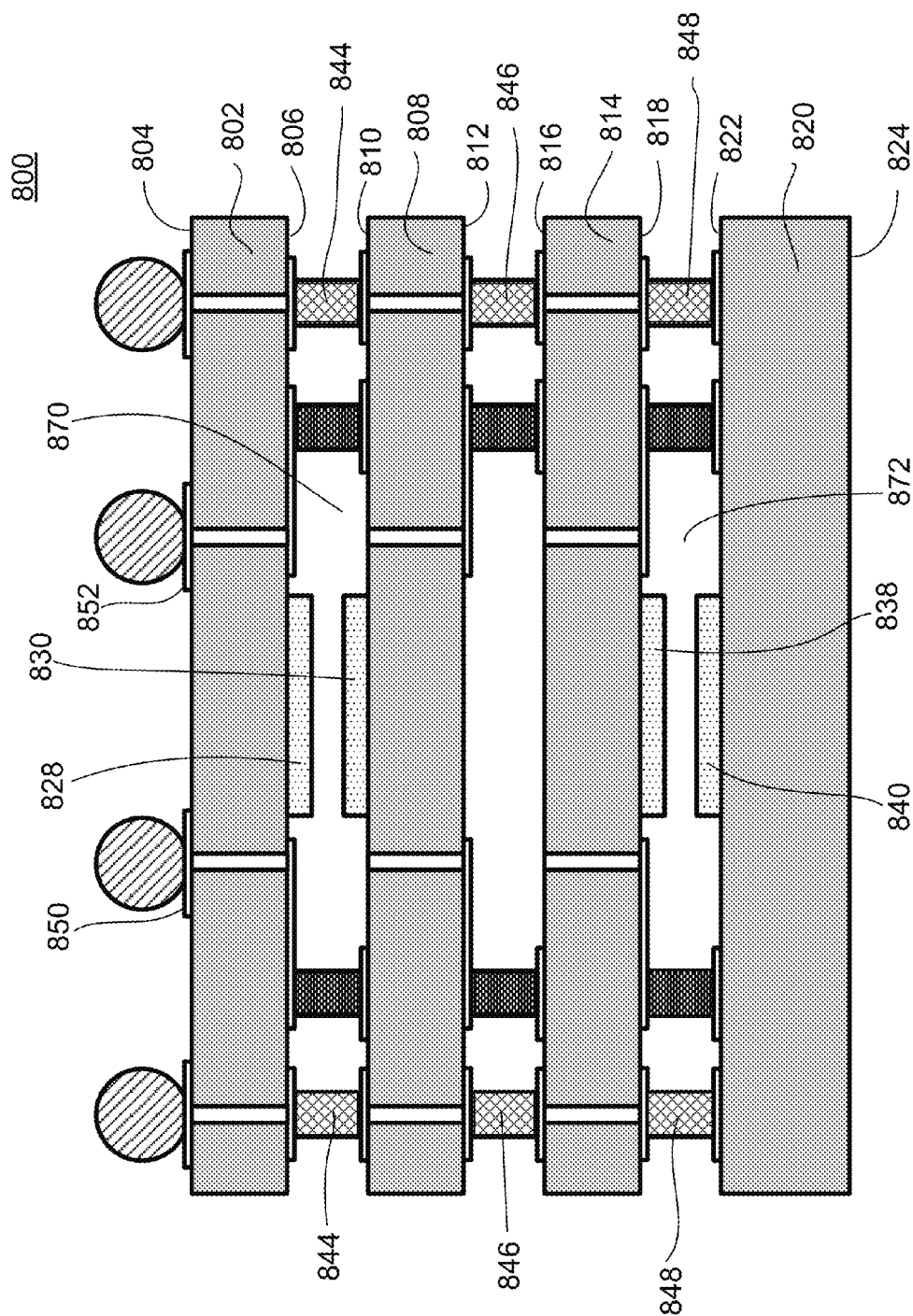
FIG. 8 shows schematically a cross sectional view of a multi-pack integrated wafer level package, according to another embodiment of the present invention.

FIG. 8 illustrates a vertically integrated dual-band duplexer in an integrated wafer level package. The integrated wafer level package 800 comprises a first wafer 802, a second wafer 808, a first BAW filter 828, and a second BAW filter 830. The first wafer 802 has a first surface 804 and an opposite, second surface 806. The second wafer 808 has a first surface 810 and an opposite, second surface 812. The first wafer 802 and the second wafer 808 are spaced apart such that the second surface 806 of the first wafer 802 faces the first surface 810 of the second wafer 808, defining a first gap therebetween. The first BAW filter 828 is disposed on the second surface 806 of the first wafer 802, and the second BAW filter 830 is disposed on the first surface 810 of the second wafer 808. The first BAW filter 828 faces directly the second BAW filter 830, defining a second gap therebetween.

Still referring to FIG. 8, the integrated wafer level package 800 further comprises a third wafer 814, a fourth wafer 820, a third BAW filter 838, and a fourth BAW filter 840. The third wafer 814 has a first surface 816 and an opposite, second surface 818. The third wafer 814 and the second wafer 808 are spaced apart such that the first surface 816 of the third wafer 814 faces the second surface 812 of the second wafer 808, defining a third gap therebetween. The fourth wafer 820 has a first surface 822 and an opposite, second surface 824. The fourth wafer 820 and the third wafer 814 are spaced apart such that the first surface 822 of the fourth wafer 820 faces the second surface 818 of the third wafer 814, defining a fourth gap therebetween. The third BAW filter 838 is disposed on the second surface 818 of the third wafer 814. The fourth BAW filter 840 is disposed on the first surface 822 of the fourth wafer 820. The third BAW filter 838 directly faces the fourth BAW filter 840, defining a fifth gap therebetween.

Still referring to FIG. 8, the integrated wafer level package 800 further comprises a first seal ring 844, a second seal ring 846, and a third seal ring 848. The first seal ring 844 is disposed between the first wafer 802 and the second wafer 808 such that a first seal is formed surrounding the first BAW filter 828 and the second BAW filter 830 and defining a first cavity 870 between the first seal ring 844 and the first BAW filter 828 and the second BAW filter 830. The second seal ring 846 is disposed between the second wafer 808 and the third wafer 814. The third seal ring 848 is disposed between the third wafer 814 and the fourth wafer 824 such that a second seal is formed surrounding the third BAW filter 838 and the fourth BAW filter 840 and defining a second cavity 872 between the third seal ring 848 and the third BAW filter 838 and the fourth BAW filter 840. Each of the first seal formed by the first seal ring 844 and the second seal formed by the third seal ring 848 may be a hermetic seal or a non-hermetic seal. The second seal ring 846 facilitates the electrical coupling between the first seal ring and the third seal ring and hermiticity is not required. The second seal ring 846 may be made of a material different from that of the first or the third seal ring.

The integrated wafer level package 800 further comprises at least one external contact 850/852 that is accessible externally to the wafer level package and is electrically coupled to at least one of the first BAW filter 828, the second BAW filter 830, the third BAW filter 838, or the fourth BAW filter 840.

While the embodiment described immediately above illustrates a multi-pack integrated wafer level package comprising two individual packages, more than two individual packages, such as three or four individual packages, can be integrated in a similar fashion.

Example 3

Figure 9:
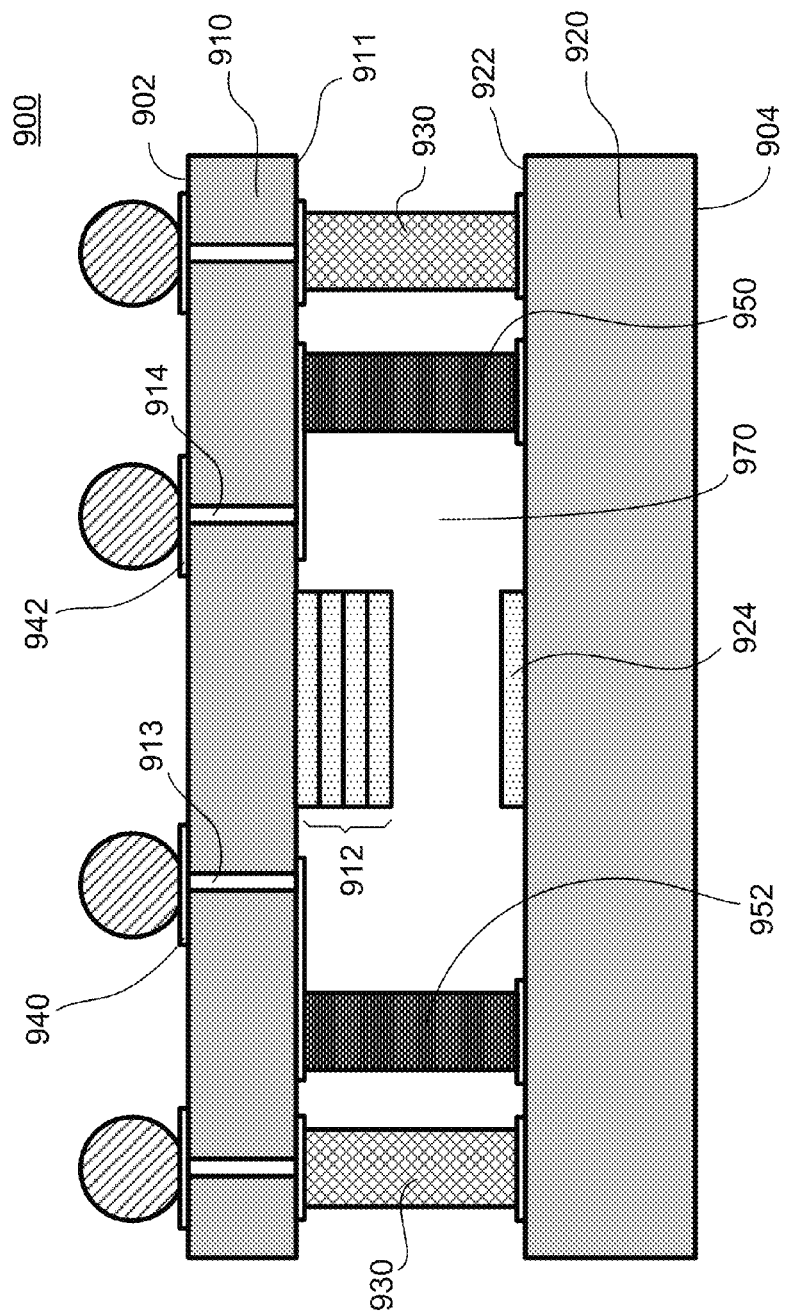
FIG. 9 shows schematically a cross sectional view of an integrated wafer level package, according to a further embodiment of the present invention.

FIG. 9 shows one embodiment of an integrated wafer level package 900 of the invention. The integrated wafer level package 900 includes a first wafer 910, a second wafer 920, a first micro device 912, a second micro device 924, and a seal ring 930. The first wafer 910 has a first surface 902 and an opposite, second surface 911. The second wafer 920 has a first surface 922 and an opposite, second surface 904. The first wafer 910 and the second wafer 920 are spaced apart such that the second surface 911 of the first wafer 910 faces the first surface 922 of the second wafer 920, defining a first gap therebetween. The first micro device 912 is disposed on the second surface 911 of the first wafer 910. The second micro device 924 is disposed on the first surface 922 of the second wafer 920. The first micro device 912 faces directly the second micro device 924, defining a second gap therebetween. The seal ring 930 is disposed between the first wafer 910 and the second wafer 920 such that a seal is formed surrounding the first micro device 912 and the second micro device 924 and defining a cavity 970 between the seal ring 930 and the first micro device 912 and the second micro device 924. The seal formed by the seal ring 930 may be a hermetic seal or a non-hermetic seal.

The integrated wafer level package 900 further comprises a first external contact 940 that is electrically coupled to the first micro device 912, and a second external contact 942 that is electrically coupled to the second micro device 924. In one embodiment, the first wafer 910 has a first via 913 through which an electrical coupling between the first external contact 940 and the first micro device 912 is made, and a second via 914 through which an electrical coupling between the second external contact 942 and the second micro device 924 is made. In alternative embodiments, the integrated wafer level package may comprise more or fewer external contacts.

In one embodiment, the integrated wafer level package 900 further comprises a first column 952 and a second column 950 disposed between the first wafer 910 and the second wafer 920. The first column 952 is aligned with or adjacent to the first via 913, and the second column 950 is aligned with or adjacent to the second via 914. In one embodiment, the first column 952 is electrically coupled to the first external contact 940 and to the first micro device 912. The second column 950 is electrically coupled to the second external contact 942 and to the second micro device 924, thereby facilitating the electrical coupling between the second external contact 942 and the second micro device 924. In another embodiment, the first column 952 may be electrically coupled to both the first micro device 912 and the second micro device 924, thereby electrically connecting the first micro device 912 with the second micro device 924. In this case, the first external contact provides access to both micro devices through the first via 913. Similarly, the second column 950 may be electrically coupled to both the first micro device 912 and the second micro device 924. In this case, the second external contact 942 provides access to both micro devices through the second via 914.

In one embodiment, each of the first micro device and the second micro device may be a BAW filter, a passive device (for example and without limitation, an inductor or a capacitor), or a RF switch built on silicon or other substrates (for example and without limitation, silicon-on-insulator, or sapphire). In some embodiments, BAW filters, passive components, and RF switches can be integrated into a single wafer package to form an RF front end module (e.g., Switchplexer). Advantages of such a module include significant form factor miniaturization, replacement of long two dimensional interconnects with shorter vertical interconnects, and the reduction of parasitics and performance improvement.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An integrated wafer level package, comprising:
    (a) a first wafer having a first surface and an opposite, second surface;
    (b) a second wafer having a first surface and an opposite, second surface, wherein the first wafer and the second wafer are spaced apart such that the second surface of the first wafer faces the first surface of the second wafer, defining a first gap therebetween;
    (c) a first bulk acoustic wave (BAW) filter disposed on the second surface of the first wafer;
    (d) a second BAW filter disposed on the first surface of the second wafer, wherein the first BAW filter faces directly the second BAW filter, defining a second gap therebetween;
    (e) a seal ring disposed between the first wafer and the second wafer such that a seal is formed surrounding the first BAW filter and the second BAW filter and defining a cavity between the seal ring and the first BAW filter and the second BAW filter;
    (f) at least one external contact that is accessible externally to the wafer level package and is electrically coupled to at least one of the first BAW filter and the second BAW filter;
    (g) a first protective layer surrounding the first BAW filter and defining a cavity therebetween; and
    (h) a second protective layer surrounding the second BAW filter and defining a cavity therebetween.

2. The integrated wafer level package of claim 1, wherein the seal formed by the seal ring is a hermetic seal.

3. The integrated wafer level package of claim 1, further comprising at least one solder bump disposed on the at least one external contact.

4. The integrated wafer level package of claim 1, wherein the at least one external contact comprises a first external contact electrically coupled to the first BAW filter, and a second external contact electrically coupled to the second BAW filter.

5. The integrated wafer level package of claim 4, wherein the first wafer has a first via through which an electrical coupling between the first external contact and the first BAW filter is made, and a second via through which an electrical coupling between the second external contact and the second BAW filter is made.

6. The integrated wafer level package of claim 5, wherein each of the first via and the second via is formed by at least one of wet etching, dry etching, deep reactive ion etching (DRIE), ultrasonic milling, drilling, mechanical drilling, or laser drilling.

7. The integrated wafer level package of claim 5, wherein each of the first via and the second via is filled with a conductive material.

8. The integrated wafer level package of claim 5, further comprising:
   (a) a first column disposed between the first wafer and the second wafer and adjacent to the first via, thereby facilitating the electrical coupling between the first external contact and the first BAW filter, or between the first external contact and the second BAW filter; and
   (b) a second column disposed between the first wafer and the second wafer and adjacent to the second via, thereby facilitating the electrical coupling between the second external contact and the second BAW filter, or between the second external contact and the first BAW filter.

9. The integrated wafer level package of claim 8, wherein the first column is electrically coupled to at least one of the first BAW filter and the second BAW filter.

10. The integrated wafer level package of claim 8, wherein the second column is electrically coupled to at least one of the first BAW filter and the second BAW filter.

11. The integrated wafer level package of claim 1, wherein the seal is formed by bonding the seal ring with the first wafer and the second wafer by at least one of anodic bonding, thermal compression bonding, eutectic bonding, solder bonding, glass frit bonding, adhesive bonding, or polymer bonding.

12. The integrated wafer level package of claim 1, wherein the seal ring comprises:
   (a) a first metal pad disposed on the second surface of the first wafer;
   (b) a second metal pad disposed on the first surface of the second wafer;
   (c) a dielectric ring formed on the second metal pad; and
   (d) a metal layer surrounding the dielectric ring, the top surface of the metal layer being bonded with the first metal pad.

13. The integrated wafer level package of claim 12, wherein the first metal pad, the second metal pad, and the metal layer are made of a same material, or different materials.

14. The integrated wafer level package of claim 12, wherein each of the first metal pad, the second metal pad, and the metal layer is made of a material including Cu, Au, Ge, Al, Ni, Ag, or a combination thereof, and the dielectric ring is made of $SiO_2$, SiN, $Al_2O_3$, spin-on glass (SOG), or glass frit.

15. The integrated wafer level package of claim 1, wherein the seal ring comprises:
   (a) a first metal pad disposed on the second surface of the first wafer;
   (b) a second metal pad disposed on the first surface of the second wafer; and
   (c) a metal ring formed on the second metal pad, the top surface of the metal ring being bonded with the first metal pad.

16. The integrated wafer level package of claim 15, wherein the first metal pad, the second metal pad, and the metal ring are made of a same material, or different materials.

17. The integrated wafer level package of claim 15, wherein each of the first metal pad, the second metal pad, and the metal ring is made of a material including Cu, Au, Ge, Al, Ni, Ag, or a combination thereof, and the metal ring is formed by one of electroplating, electroless plating, physical vapor deposition (PVD), or chemical vapor deposition (CVD).

18. The integrated wafer level package of claim 1, wherein the seal ring comprises:
   (a) a first metal pad disposed on the second surface of the first wafer;
   (b) a second metal pad disposed on the first surface of the second wafer;
   (c) a metal ring formed on the second metal pad;
   (d) a diffusion barrier formed on the top surface of the metal ring; and
   (e) a solder layer formed on the diffusion barrier, the top surface of the solder layer being bonded with the first metal pad.

19. The integrated wafer level package of claim 18, wherein each of the first metal pad and the second metal pad is made of a material including Au, Ag, Ni, Cu, Ti, or a combination thereof, the metal ring is made of Au or Cu, and the solder layer is made of a composite material comprising Sn and at least one of Au, Ag, Cu, Zn, Si, Ge, Pb, In, Bi, and Sb.

20. The integrated wafer level package of claim 18, wherein the metal ring is formed by one of electroplating, electroless plating, physical vapor deposition (PVD), or chemical vapor deposition (CVD).

21. The integrated wafer level package of claim 1, wherein the seal ring comprises:
   (a) a first metal pad disposed on the second surface of the first wafer;
   (b) a dielectric film formed on the first metal pad, wherein the dielectric film, the first metal pad, and the first wafer define a third via that runs through the dielectric film and the first metal pad and ends in the body of the first wafer;
   (c) a second metal pad disposed on the first surface of the second wafer;
   (d) a first ring formed on the second metal pad, the first ring having a fourth via that runs through the height of the first ring, the top surface of the first ring being bonded with the dielectric film; and
   (e) a conductive material that fills the third via and the fourth via.

22. The integrated wafer level package of claim 21, wherein each of the first metal pad and the second metal pad is made of a material including Cu, Au, Al, or a combination thereof, and the dielectric film is made of a material including $SiO_2$, SiN, $Al_2O_3$, or spin-on glass (SOG).

23. The integrated wafer level package of claim 21, wherein the first ring is made of a dielectric material including $SiO_2$, SiN, $Al_2O_3$, spin-on-glass (SOG), or glass frit, or a polymer material including photoimagable polymer, benzocyclobutene (BCB), SU8, Parylene, Polyimide, Avatrel, polymethylmethacrylate (PMMA), polydimethylsiloxane (PDMS), or dry film resist.

24. The integrated wafer level package of claim 1, wherein the seal ring comprises:

a ring made of a non-conductive material, disposed on the first surface of the second wafer, having a top surface to be bonded to the second surface of the first wafer.

25. The integrated wafer level package of claim 1, wherein each of the first protective layer and the second protective layer is made of one of polymer material, non-metallic material, metallic material, or a combination thereof.

26. The integrated wafer level package of claim 25, wherein the polymer material includes photoimagable polymer, benzocyclobutene (BCB), SU8, Parylene, Polyimide, Avatrel, polymethylmethacrylate (PMMA), polydimethylsiloxane (PDMS), or a combination thereof, wherein the non-metallic material includes silicon oxide, silicon nitride, silicon carbide, diamond, silicon, or a combination thereof, and wherein the metallic material includes Cu, Au, Al, Pt, Ni, Ti, Cr, or a combination thereof.

\* \* \* \* \*